United States Patent
Hatem et al.

(10) Patent No.: US 9,062,367 B2
(45) Date of Patent: Jun. 23, 2015

(54) PLASMA PROCESSING OF WORKPIECES TO FORM A COATING

(75) Inventors: Christopher R. Hatem, Hampton, NH (US); Ludovic Godet, Boston, MA (US); Louis Steen, Atkinson, NH (US); Deepak A. Ramappa, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/608,709

(22) Filed: Sep. 10, 2012

(65) Prior Publication Data

US 2013/0064989 A1  Mar. 14, 2013

Related U.S. Application Data

(60) Provisional application No. 61/532,390, filed on Sep. 8, 2011.

(51) Int. Cl.
*C23C 14/48* (2006.01)
*C23C 14/12* (2006.01)
*C23C 14/04* (2006.01)
*H01J 37/32* (2006.01)

(52) U.S. Cl.
CPC .......... *C23C 14/048* (2013.01); *H01J 37/32412* (2013.01)

(58) Field of Classification Search
CPC ........ C23C 14/48; C23C 14/12; C23C 14/20; C23C 14/00; H01J 37/32412

USPC .......................................................... 427/525
See application file for complete search history.

(56) References Cited

U.S. PATENT DOCUMENTS

| | | | | |
|---|---|---|---|---|
| 7,015,503 | B2* | 3/2006 | Seki et al. ........................ | 257/40 |
| 7,148,148 | B2* | 12/2006 | Mori et al. ..................... | 438/704 |
| 7,489,368 | B2* | 2/2009 | Kim et al. ........................ | 349/43 |
| 2005/0140890 | A1* | 6/2005 | Kim et al. ..................... | 349/139 |
| 2007/0102683 | A1* | 5/2007 | Kodas et al. .................. | 252/500 |
| 2008/0197356 | A1* | 8/2008 | Kim et al. ....................... | 257/71 |

OTHER PUBLICATIONS

Chang-Koo Kim and Demetre J. Economou. Plasma molding over surface topography: energy and angular distribution of ions extrated out of large holes. Mar. 1, 2002. Journal of Applied Physics. vol. 91, No. 5. pp. 2594-2603.*

Chang-Koo Kim and Detre J. Economou. Plasma molding over surface topography: Energy and angular distribution of ions extracted out of large hols. Mar. 1, 2002. Journal of Applied Physics. vol. 91, No. 5. pp. 2594-2603.*

Alf, Mahriah E., et al., Chemical Vapor Deposition of Conformal, Functional, and Responsive Polymer Films, Advanced Materials, 2010, pp. 1993-2027, vol. 33, Wiley-VCH GmbH & Co., Weinheim Germany.

(Continued)

*Primary Examiner* — Dah-Wei D Yuan
*Assistant Examiner* — Kristen A Dagenais

(57) ABSTRACT

A surface of an insulating workpiece is implanted to form either hydrophobic or hydrophilic implanted regions. A conductive coating is deposited on the workpiece. The coating may be a polymer in one instance. This coating preferentially forms either on the implanted regions if these implanted regions are hydrophilic or on the non-implanted regions if the implanted regions are hydrophobic.

6 Claims, 5 Drawing Sheets

(56) References Cited

OTHER PUBLICATIONS

Asatekin, Ayse, et al., Designing Polymer Surfaces Via Vapor Deposition, Materials Today, May 2010, pp. 26-33, vol. 13, No. 5, Elsevier Ltd., Amsterdam, Netherlands.

Zeng, Z.M., et al., Plasma Immersion Ion Implantation into Inner and Outer Races of Industrial Bearings, Surface and Coatings Technology, Nov. 1999, pp. 663-667, vols. 120-121, Elsevier, Amsterdam, Netherlands.

* cited by examiner

PLASMA PROCESSING OF WORKPIECES TO FORM A COATING

CROSS-REFERENCE TO RELATED APPLICATIONS

This claims priority to the provisional patent application entitled "Plasma Processing of Workpieces with Polymer Coatings," filed Sep. 8, 2011 and assigned U.S. App. No. 61/532,390, the disclosure of which is hereby incorporated by reference.

FIELD

This invention relates to processing workpieces and, more particularly, to processing workpieces to form a coating.

BACKGROUND

Ion implantation is a standard technique for introducing impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material.

Insulating workpieces (or workpieces with insulating properties) provide unique challenges during plasma processing. For example, it may be difficult to electrostatically clamp or manage charge buildup on insulating workpieces. Charge buildup can lead to variations in implant or deposition depth or can lead to repeatability problems with thin workpieces. Charge buildup also can prevent some ion penetration when processing thicker insulating workpieces. Some insulating material will charge negatively during ion implantation, which will impede or decrease the effective or desired implant energy. In some embodiments, this negative charge will prevent any ion implantation. What is needed is a new method of plasma processing for insulating workpieces or, more particularly, for workpieces to form a coating.

SUMMARY

According to a first aspect of the invention, a method of workpiece processing is provided. The method comprises implanting a part of a surface of an insulating workpiece with a first ion species. Hydrophobic implanted regions are formed on a surface of the workpiece using the first ion species. A conductive coating is deposited on the workpiece. The coating is preferentially formed on non-implanted regions adjacent the implanted regions such that more of the coating is disposed on the non-implanted regions than on the implanted regions.

According to a second aspect of the invention, a method of workpiece processing is provided. The method comprises implanting a part of a surface of an insulating workpiece with a first ion species. Hydrophilic implanted regions are formed on a surface of the workpiece using the first ion species. A conductive coating is deposited on the workpiece. The coating is preferentially formed on the implanted regions whereby more of the coating is formed on the implanted regions than on a remainder of the surface.

BRIEF DESCRIPTION OF THE DRAWINGS

For a better understanding of the present disclosure, reference is made to the accompanying drawings, which are incorporated herein by reference and in which.

DETAILED DESCRIPTION

These embodiments are described in connection with an ion implanter. Beamline ion implanters, plasma doping or plasma immersion ion implanters, plasma tools that modify the plasma sheath, or ion implanters that focus an ion beam may be used. However, these embodiments can be used with other systems and processes involved in semiconductor manufacturing or other systems that form a plasma. The workpieces disclosed herein may be used for logic, memory, solar, micro-electro-mechanical systems (MEMS), biosensors, microfluidics, organic light-emitting diodes (OLEDs), display screens, or other applications. Thus, the invention is not limited to the specific embodiments described below.

Insulating workpieces are used in many applications. These insulating workpiece may be, for example, quartz, glass, ceramic, plastic, or other materials known to those skilled in the art. Polymer deposition to form a coating on the insulating workpiece may enable plasma processing of the insulating workpiece or may be used to enable specific applications. For example, the polymer deposition may provide a more uniform charge distribution of the voltage applied to the surface of the insulating workpiece.

The polymer may be, for example, polyacetylene, polyphenylene vinylene, polythiophene, polyaniline, polyphenylene sulfide, polytetrafluoroethylene, poly(3,4-ethylenedioxythiophene), polypyrrole, or other materials known to those skilled in the art. In one instance, the polymer is conductive. The workpiece may be coated on one or more surfaces with the conductive polymer. The coating may be uniform in one embodiment, though depth or height variations are possible in another embodiment. This insulating workpiece can then be clamped and undergo ion implantation. The ion implantation may be performed through the polymer in one instance and then the polymer may be removed after ion implantation.

If implantation is performed through the coating made up of the polymer, the thickness of the coating may be configured to overcome the properties of the insulating workpiece. The implantation parameters are configured to implant through this coating and reach the target depth in the insulating workpiece. In one embodiment, the deposition of the coating and the implantation may be performed in a single tool. Vacuum around the insulating workpiece may or may not be broken between deposition and implant. In another embodiment, the deposition and implantation may be performed in more than one tool.

Figure 1:
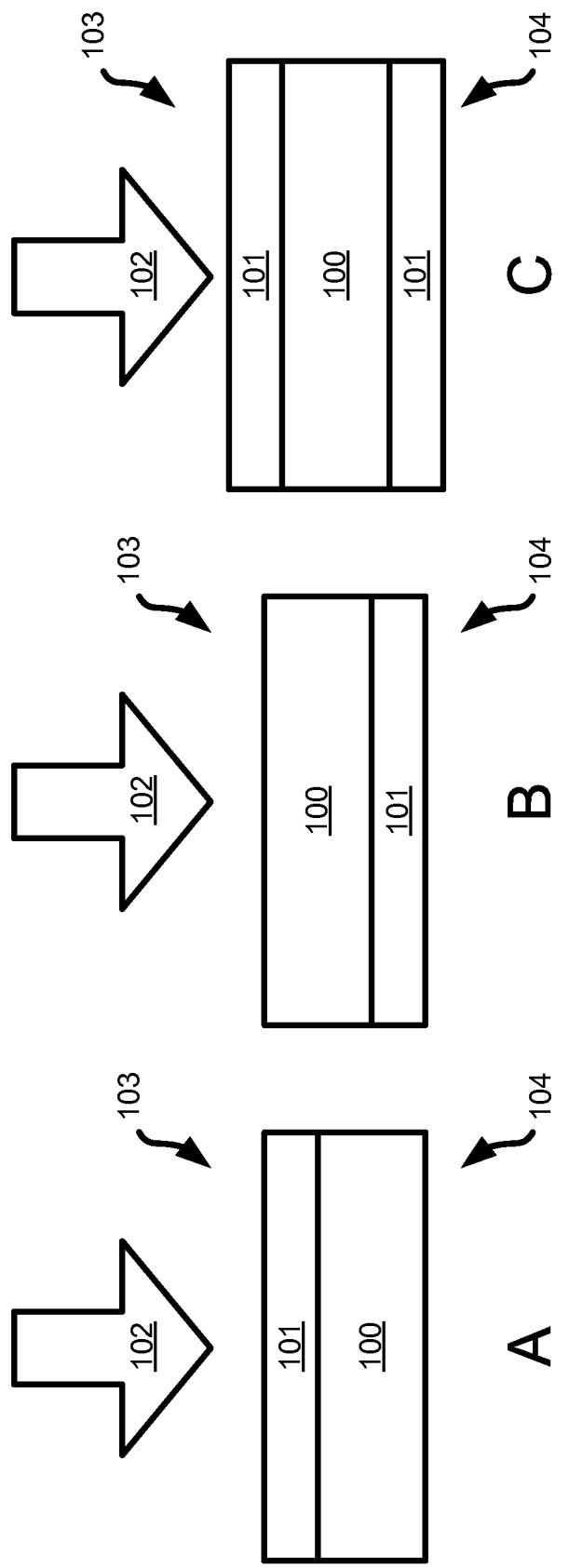
FIGS. 1A-1C illustrate three cross-sectional views of insulating workpieces with coatings.

FIGS. 1A-1C illustrate three cross-sectional views of insulating workpieces with coatings. The insulating workpiece 100 has a coating 101, which may be composed of a conductive polymer. This coating 101 may be on one of the surfaces 103, 104 or both surfaces 103, 104 of the insulating workpiece 100. Thus, the coating 101 may be on the surface 103 facing the ions 102 during plasma processing, on the surface 104 opposite the ions 102 during plasma processing, or both. In another embodiment, the coating 101 also may be on the sides between the surface 103 and surface 104.

In some applications, such as MEMS, biosensors, display screens, or microfluidics, the coating may be deposited in a pattern. Such a pattern may be specific to the particular application. By covering part of a workpiece, this patterned deposition may enable one region to be hydrophobic while masking another region of the workpiece that is inherently hydrophilic (or vice versa). The coating may have additional process steps performed on it, such as ion implantation, to render it either hydrophobic or hydrophilic.

Such a pattern may be formed with a locally-exposed plasma or ion beam treatment with or without a masking step. A selected region of the workpiece is exposed to the plasma or ions to either induce selective deposition of the coating or to selectively inhibit deposition of the coating. The polymer, for example, in the coating may be affected by the implanted regions formed during the plasma process or implantation process. A stencil mask, shadow mask, or system that focuses ions may be used to process the selected region of the workpiece.

Inducing deposition of the coating may occur by roughening the surface of the insulating workpiece, implanting a species that forms bubbles in the surface of the insulating workpiece, depositing a species that roughens the surface of the insulating workpiece, or creating hydrophilic regions on or in the insulating workpiece. Various species may be used to induce deposition or render the insulating workpiece hydrophilic, including ions of helium, other noble gases, $SF_6$, or molecules containing oxygen.

Inhibiting deposition may occur by creating hydrophobic regions on the insulating workpiece. Ions of $CF_4$, $CHF_3$, C, Si, molecules containing carbon, or molecules containing Si, for example, may be implanted to inhibit deposition. In one possible mechanism, the surface energy is changed and, in turn, adhesion properties are altered.

FIGS. 2A-2B and 3A-3B illustrate perspective views of a first and second embodiment of deposition on a workpiece. A conductive polymer is deposited on the insulating workpieces to form the coating in these embodiments. Deposition may occur using a deposition tool or by spraying, dipping, or other methods known to those skilled in the art.

Figure 2B:
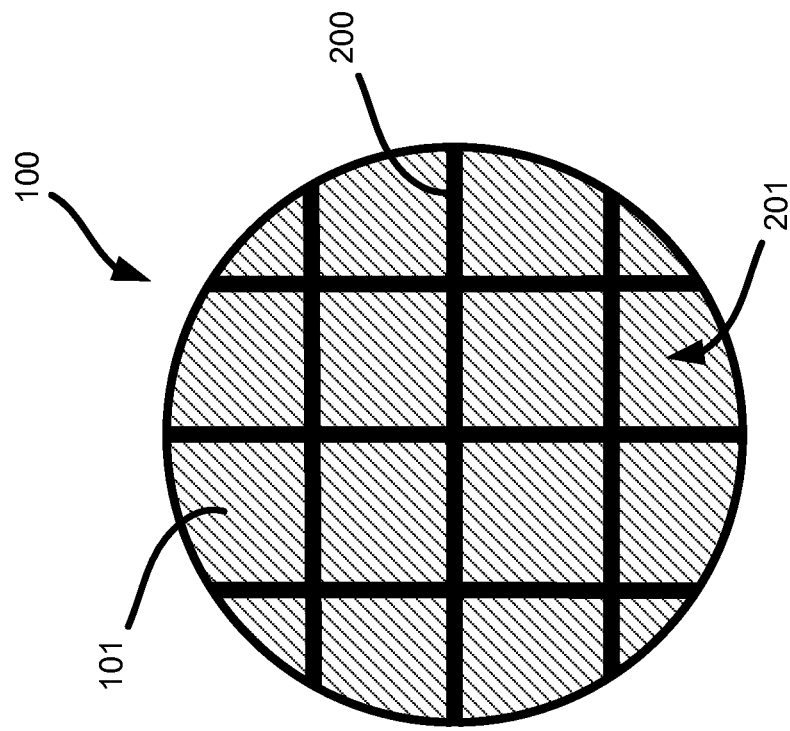
FIG. 2A-2B illustrate perspective views of a first embodiment of deposition on a workpiece.
Figure 2A:
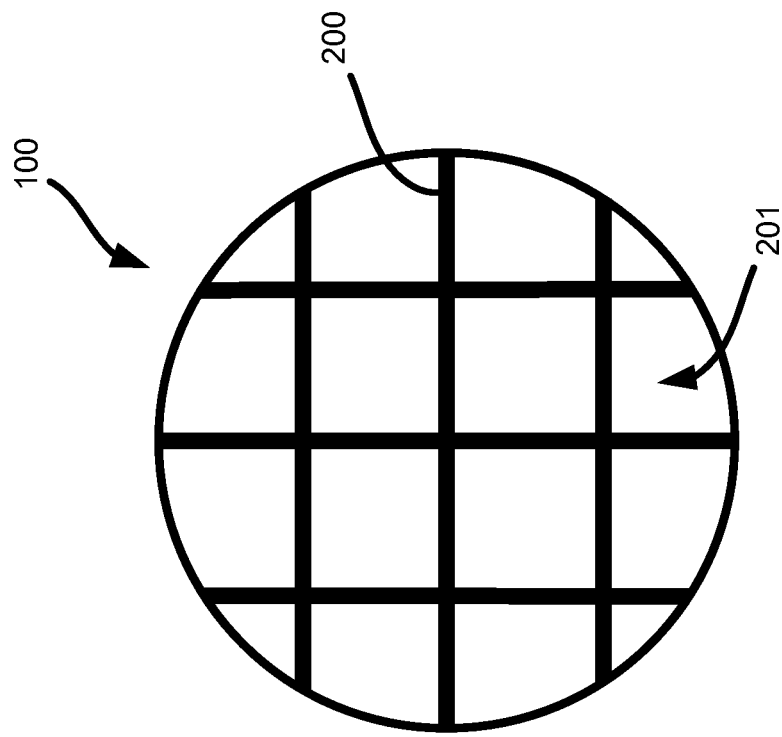

In FIG. 2A, part of a surface of an insulating workpiece 100 is implanted with a first ion species. This forms the implanted regions 200, which in this instance are hydrophobic. In FIG. 2A, these implanted regions 200 are illustrated as a series of lines that form a grid on the surface of the insulating workpiece 100. Non-implanted regions 201 are located adjacent, between, or around the implanted regions 200. In FIG. 2B, the coating 101 is deposited on the workpiece 100. The coating 101 (represented by the hash marks) preferentially forms on the non-implanted regions 201 and, consequently, more of the coating 101 forms on the non-implanted regions 201 than on the implanted regions 200. This is at least partly because the implanted regions 200 are hydrophobic. Some of the coating 101 may deposit on the implanted regions 200, but the height of any coating 101 on the implanted regions 200 may be less than the height of the coating 101 on the non-implanted regions 201. However, in another instance no coating 101 forms on the implanted regions 200.

Figure 3B:
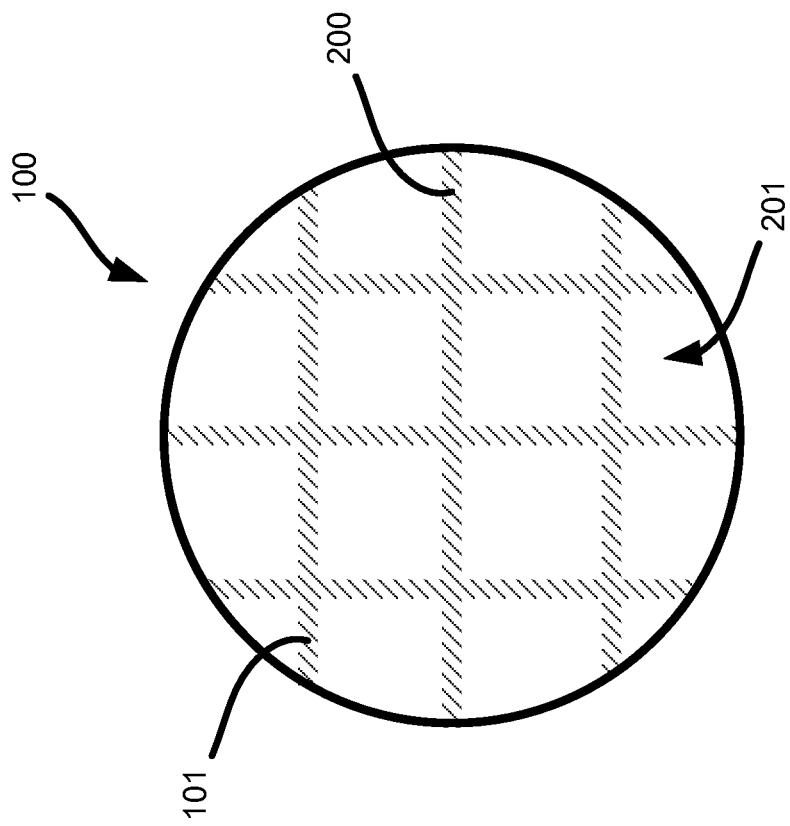
FIG. 3A-3B illustrate perspective views of a second embodiment of deposition on a workpiece.
Figure 3A:
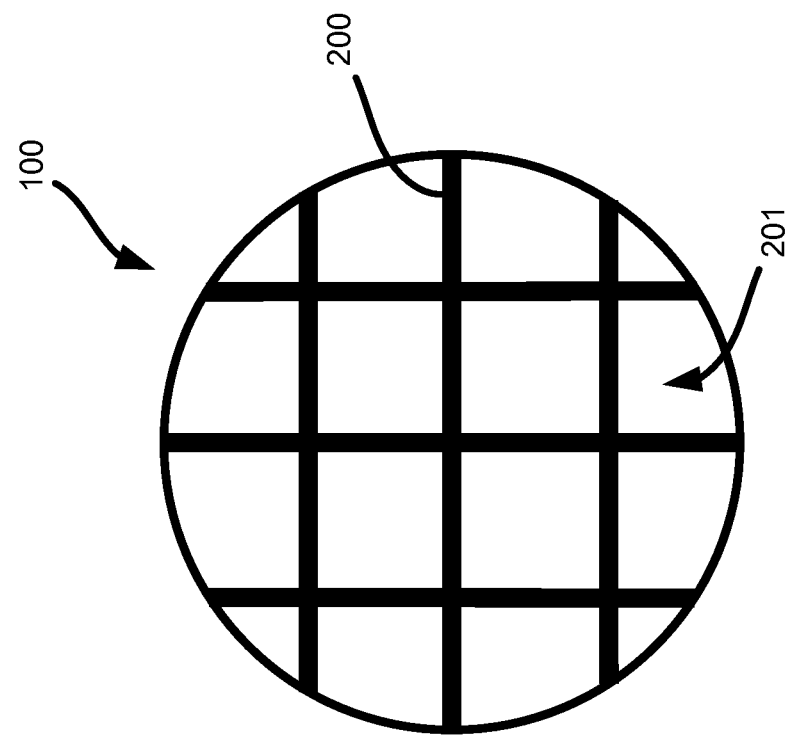

In FIG. 3A, part of a surface of an insulating workpiece 100 is implanted with a first ion species. This forms the implanted regions 200, which in this instance are hydrophilic. In FIG. 3A, these implanted regions 200 are illustrated as a series of lines that form a grid on the surface of the insulating workpiece 100. Non-implanted regions 201 are located adjacent, between, or around the implanted regions 200. In FIG. 3B, the coating 101 is deposited on the workpiece 100. The coating 101 (represented by the hash marks) preferentially forms on the implanted regions 200 and, consequently, more of the coating 101 forms on the implanted regions 200 than on the non-implanted regions 201. Thus, the coating 101 preferentially forms on the implanted regions 200 and not on the non-implanted regions 201. This is at least partly because the implanted regions 200 are hydrophilic. Some of the coating 101 may deposit on the non-implanted regions 201, but the height of any coating 101 on the non-implanted regions 201 may be less than the height of the coating 101 on the implanted regions 200. However, in another instance no coating 101 forms on the non-implanted regions 201.

Specific patterns of implantation are illustrated in FIGS. 2A-2B and 3A-3B. The illustrated grids are merely used as examples. Other shapes or patterns are possible. The dimensions of the implanted regions 200 may be configured to compensate for any loss of fidelity of the dimensions of the coating 101 compared to the implanted regions 200. For example, if it is known that the coating 101 will deposit to be slightly greater than the width of the implanted regions 200, then the width of the implanted regions 200 may be adjusted to enable the coating 101 to be the desired width after deposition.

While specific implant species are listed, other species also may be implanted. For example, the insulating workpiece may be implanted with ion species such as N, H, F, B, As, P, Ge, Ga, Zn, Al, or other p-type or n-type dopants. The ion species that is implanted may in part affect the hydrophobicity or hydrophilicity. Certain energy levels or doses during implantation may modify the lattice structure of the insulating workpiece, which also may in part affect the hydrophobicity or hydrophilicity. Other mechanisms due to implant that affect the hydrophobicity or hydrophilicity may be possible. The implant species may be mixed with a dilutant species or an additional species in one embodiment. In another embodiment, the implant species may be part of a combination of species that each affects hydrophobicity or hydrophilicity.

The coating on the insulating workpiece may be additionally patterned after deposition. This may enable a particular application for the coating and may involve etching or other processes. The properties of the coating on the insulating workpiece also can be patterned or changed with a plasma or ion beam treatment. For example, a coating deposited on the insulating workpiece can be processed with an ion beam or plasma with or without a masking step to create non-conductive regions. Argon, helium, xenon, another noble gas, or other active or inactive species may be used to break the polymers to render them non-conductive. Similarly, a coating can be treated with an ion beam or plasma with or without a masking step to create local hydrophilic or hydrophobic regions in the coating. These may be performed for a specific application. In these examples, the coating may be deposited in either blanket or patterned manner.

Implanting either the insulating workpiece or the coating has the advantage that any properties of the implanted regions are due to the implanted region rather than an additional layer. Thus, these properties are not removed by cleaning or other processing. At least a few layers or few nanometers of the insulating workpiece or coating are implanted to form the implanted region. One or more implants may be performed to obtain the desired properties. Uniformity and dose may be controlled to obtain approximately equal values of the desired properties across the implanted region.

Figure 4:
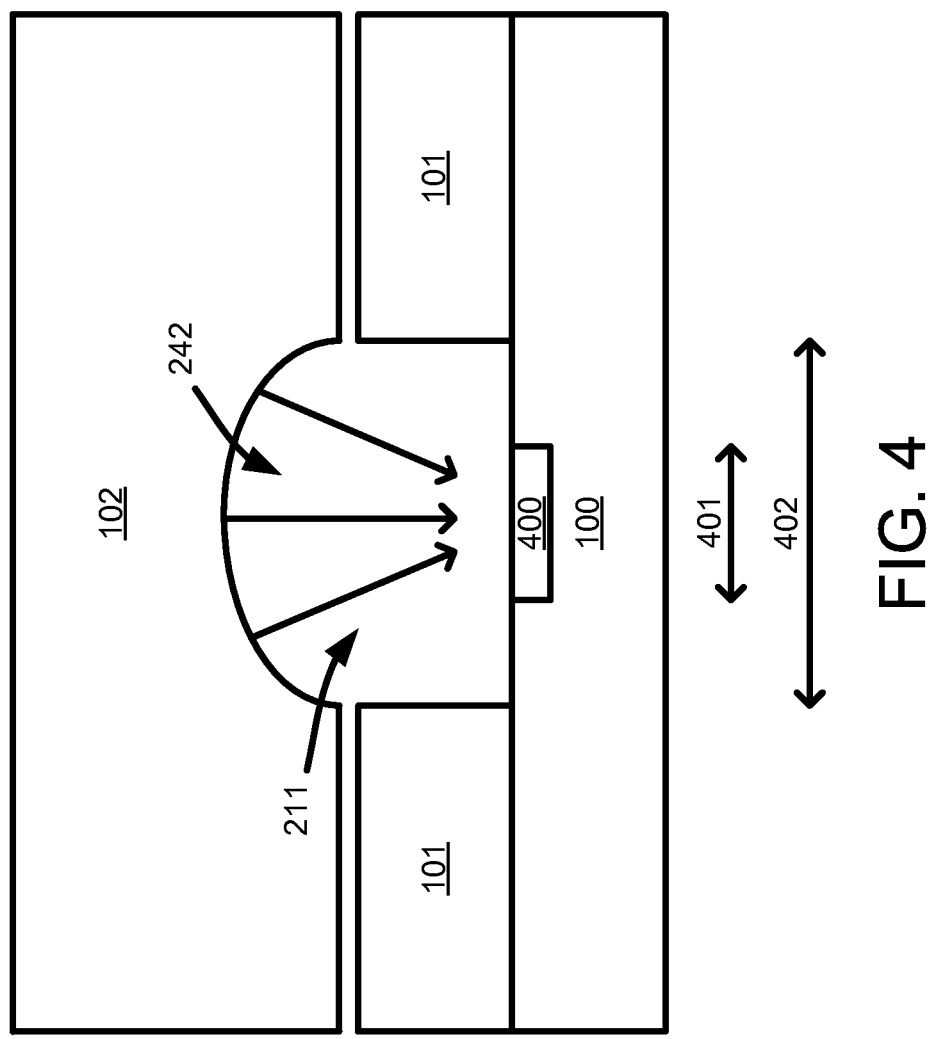
FIG. 4 is a cross-sectional view of focusing an ion beam using a coating.

FIG. 4 is a cross-sectional view of focusing an ion beam using a coating. The coating 101, which may be a conductive polymer, may be deposited in a pattern on the insulating workpiece 100 as described above or may have a pattern created (such as with selective etching) such that the coating 101 focuses the ions 102 during processing. A plasma sheath 242 is created by the coating 101 and enables greater focusing into small regions of the insulating workpiece 100. This is illustrated by the trajectories 211 that are represented by the arrows pointing toward the implanted region 400.

Thus, the implanted region 400 in the insulating workpiece 100 has a width 401 less than the dimension 402 of the opening in the coating 101. For example, the ions 102 may be focused to a region less than 50 μm using this embodiment. This may be cheaper than existing manufacturing processes or may produce smaller features than is possible with a lithography mask. For example, this process may be performed because the focus of the plasma or implant tool is insufficient to form the implanted region 400. In another example, this process may be performed to eliminate a focusing lens from a plasma or implant tool to form the implanted region 400. Any species can be implanted to form the implanted region 400 and the particular dimensions and implant species may be specific to a particular application.

Figure 5:
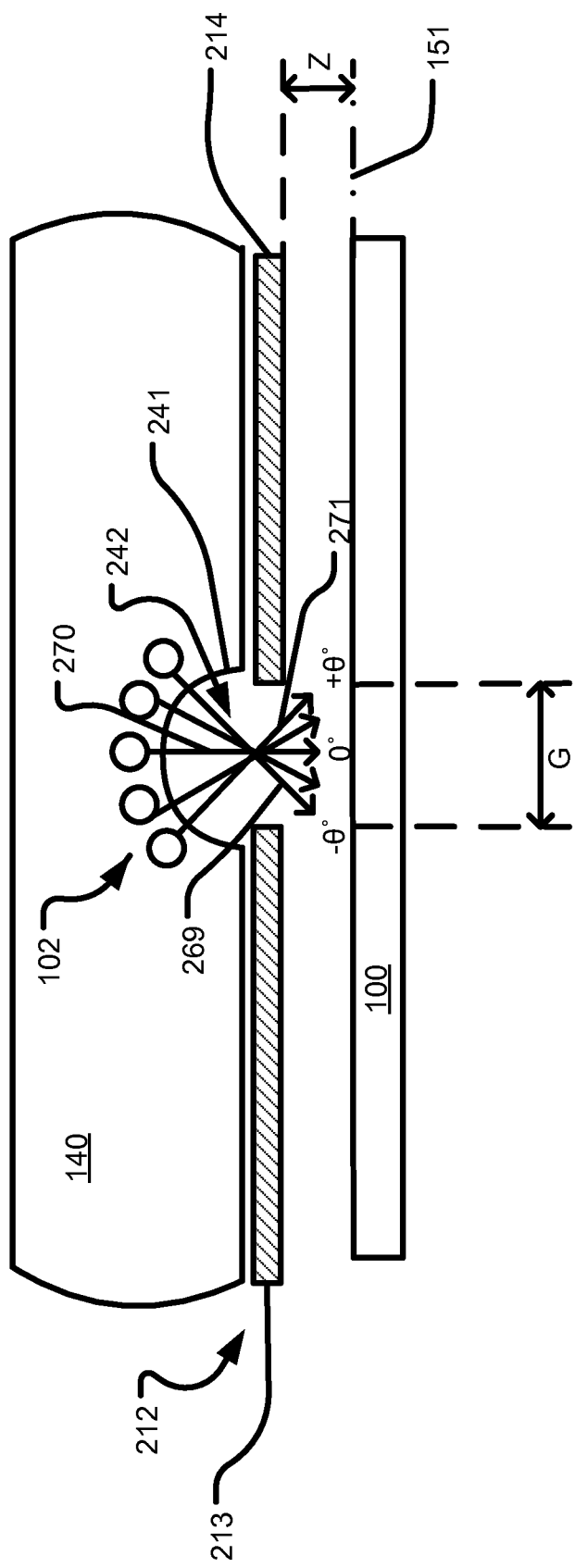
FIG. 5 is a block diagram of a plasma processing apparatus having a plasma sheath modifier.

Selective implant, selective plasma processing, or selective etching may be performed in a plasma processing system that has a plasma sheath modifier in one specific embodiment. FIG. 5 is a block diagram of a plasma processing apparatus having a plasma sheath modifier. The plasma 140 is generated as is known in the art. This plasma 140 is generally a quasi-neutral collection of ions and electrons. The ions typically have a positive charge while the electrons have a negative charge. The plasma 140 may have an electric field of, for example, approximately 0 V/cm in the bulk of the plasma 140. In a system containing the plasma 140, ions 102 from the plasma 140 are attracted toward a workpiece 100, which may be insulating. These ions 102 may be attracted with sufficient energy to be implanted into the workpiece 100 or may just deposit or etch the workpiece 100. The plasma 140 is bounded by a region proximate the workpiece 100 referred to as a plasma sheath 242. The plasma sheath 242 is a region that has fewer electrons than the plasma 140. Hence, the differences between the negative and positive charges cause a sheath potential in the plasma sheath 242. The light emission from this plasma sheath 242 is less intense than the plasma 140 because fewer electrons are present and, hence, few excitation-relaxation collisions occur. Thus, the plasma sheath 242 is sometimes referred to as "dark space."

The plasma sheath modifier 212 is configured to modify an electric field within the plasma sheath 242 to control a shape of a boundary 241 between the plasma 140 and the plasma sheath 242. Accordingly, ions 102 that are attracted from the plasma 140 across the plasma sheath 242 may strike the workpiece 100 at a large range of incident angles. This plasma sheath modifier 212 may be referred to as, for example, a focusing plate or sheath engineering plate.

In the embodiment of FIG. 5, the plasma sheath modifier 212 includes a pair of panels 213 and 214 defining an aperture there between having a horizontal spacing (G). The panels 213 and 214 may be an insulator, semiconductor, or conductor. In other embodiments, the plasma sheath modifier 212 may include only one panel or more than two panels. The panels 213 and 214 may be a pair of sheets having a thin, flat shape. In other embodiments, the panels 213 and 214 may be other shapes such as tube-shaped, wedge-shaped, and/or have a beveled edge proximate the aperture. The panels 213 and 214 also may be positioned a vertical spacing (Z) above the plane 151 defined by the front surface of the workpiece 100. In one embodiment, the vertical spacing (Z) may be about 1.0 to 10.0 mm.

Ions 102 may be attracted from the plasma 140 across the plasma sheath 242 by different mechanisms. In one instance, the workpiece 100 is biased to attract ions 102 from the plasma 140 across the plasma sheath 242. In another instance, a plasma source that generates the plasma 140 and walls surrounding the plasma 140 are biased positively and the workpiece 100 may be grounded. The biasing may be pulsed in one particular embodiment. In yet another instance, electric or magnetic fields are used to attract ions 102 from the plasma 140 toward the workpiece 100.

Advantageously, the plasma sheath modifier 212 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 in one instance. When the workpiece 100 is biased, for example, the ions 102 are attracted across the plasma sheath 242 through the aperture between the panels 213 and 214 at a large range of incident angles. For instance, ions 102 following trajectory path 271 may strike the workpiece 100 at an angle of $+\theta°$ relative to the plane 151. Ions 102 following trajectory path 270 may strike the workpiece 100 at about an angle of 0° relative to the same plane 151. Ions 102 following trajectory path 269 may strike the workpiece 100 an angle of $-\theta°$ relative to the plane 151. Accordingly, the range of incident angles may be between $+\theta°$ and $-\theta°$ centered about 0°. In addition, some ion trajectories paths such as paths 269 and 271 may cross each other. Depending on a number of factors including, but not limited to, the horizontal spacing (G) between the panels 213 and 214, the vertical spacing (Z) of the panels 213 and 214 above the plane 151, the dielectric constant of the panels 213 and 214, or other process parameters of the plasma 140, the range of incident angles ($\theta$) may be between $+60°$ and $-60°$ centered about 0°.

The workpiece 100 may be translated with respect to the plasma sheath modifier 212. The implantation of the workpiece 100 may be stopped or varied during translation to enable patterned implant, deposition, or etching The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:
1. A method of workpiece processing comprising:
   implanting a part of a surface of a workpiece with a first ion species, wherein said workpiece is insulating;
   forming implanted regions on a surface of said workpiece using said first ion species, wherein said implanted regions are hydrophobic;
   depositing a coating on said surface of said workpiece after said implanting, wherein said coating is conductive;
   preferentially forming said coating on non-implanted regions adjacent said implanted regions on said surface whereby more of said coating is disposed on said non-implanted regions than on said implanted regions; and implanting said workpiece with a second ion species after said depositing, wherein said conductive coating forms a plasma sheath and said second ion species is focused by plasm sheath in regions of said surface located between said coating.

2. The method of claim 1, wherein said first ion species comprises at least one of $CF_4$, $CHF_3$, C, Si, a molecule containing carbon, or a molecule containing Si.

3. The method of claim 1, wherein said coating comprises a polymer.

4. The method of claim 1, wherein said implanting comprises using one of a stencil mask or a shadow mask to implant said part of said surface.

5. The method of claim 1, wherein said implanting comprises focusing said first ion species to implant said part of said surface.

6. The method of claim 1, wherein said second ion species forms a second implanted region in said workpiece, wherein a width of said second implanted region is less than a dimension of an opening in said coating.

* * * * *